(12) United States Patent
Maejima et al.

(10) Patent No.: US 6,696,877 B2
(45) Date of Patent: Feb. 24, 2004

(54) LEVEL SHIFT CIRCUIT

(75) Inventors: Toshio Maejima, Iwata (JP); Akihiko Toda, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/137,573

(22) Filed: May 2, 2002

(65) Prior Publication Data

US 2002/0171465 A1 Nov. 21, 2002

(30) Foreign Application Priority Data

May 15, 2001 (JP) ........................................ 2001-145328

(51) Int. Cl.$^7$ ................................................ H03L 5/00
(52) U.S. Cl. ...................... 327/333; 327/561; 327/307
(58) Field of Search ................................ 327/333, 307, 327/77–79, 85, 87, 88, 561, 563; 330/69; 326/80, 81

(56) References Cited

U.S. PATENT DOCUMENTS 4,207,536 A * 6/1980 Lewis ........................... 330/69
5,914,635 A * 6/1999 Yamamoto ................... 327/561
6,232,816 B1 * 5/2001 Ueda ........................... 327/307

FOREIGN PATENT DOCUMENTS

JP 60-117903 6/1985
JP 6-21733 1/1994

* cited by examiner

Primary Examiner—Long Nguyen
(74) Attorney, Agent, or Firm—Pillsbury Winthrop LLP

(57) ABSTRACT

Level shift circuit includes an operational amplifier, and an input resistor having one end connected to an output terminal of an amplifier circuit and the other end connected to the inverted input terminal of the operational amplifier. The level shift circuit further includes a level-shifting resistor of a resistance value R0 having one end connected to the inverted input terminal of the operational amplifier and the other end connected to a ground, and a feedback resistor of a resistance value R1. Reference voltage Vref is applied to the noninverted input terminal of the operational amplifier. Output signal of the level shift circuit represents the output of the amplifier circuit having been shifted in level by a predetermined amount. If the amplitude center level of the output signal from the level shift circuit is represented by Vc, the level shift amount ΔV can be expressed as $$\Delta V = Vc - Vref = (R1/R0)Vref$$

With such arrangements, the level shift circuit can operate appropriately using only one reference voltage, without requiring any external capacitor.

4 Claims, 6 Drawing Sheets

LEVEL SHIFT CIRCUIT

BACKGROUND OF THE INVENTION

The present invention relates to an improved level shift circuit for shifting an amplitude center level of an A.C. input signal.

When a power supply voltage changes in amplifier circuitry connected to a single power supply, it becomes necessary to shift the amplitude center level of an input signal. In portable devices or the like, where a lithium-ion battery of 3.6 volts is employed, the battery power is used at their control stage after having been lowered via a regulator to 3.0 volts, while the 3.6-volt battery power is directly used at their power stage without being passed through the regulator. In such cases, the amplitude center level of an input signal is controlled to amount to 1.5 volts in an amplifier circuit of the control stage, and it is controlled to amount to 1.8 volts in an amplifier circuit of the power stage. Namely, in such amplifier circuitry, the amplitude center level has to be raised to 1.8 volts at the power stage by means of a level shift circuit.

In FIG. 6, there is shown an example of a conventionally-known level shift circuit of the above-discussed type. In the circuit of FIG. 6, an amplitude center level Vref1 (see a waveform W1 on the left of the figure) is applied to an amplifier circuit 4 that comprises resistors 1 and 2 and an operational amplifier 3, and an amplified output of the amplifier circuit 4 is then level-shifted, via a D.C.-cutting capacitor 5 and another amplifier circuit 9, into a signal having an amplitude center level Vref2. Here, the D.C.-cutting capacitor 5 is provided outside an integrated circuit chip having the amplifier circuit 4 fabricated thereon, and the amplified output of the amplifier circuit 4 is passed through the capacitor 5 and then applied to an input terminal of the amplifier circuit 9 comprising resistors 6 and 7 and an operational amplifier 8. Reference voltage Vref2 is applied to a noninverted input terminal of the operational amplifier 8. In this way, the amplifier circuit 9 can output an amplified signal having the amplitude center level Vref2 as illustrated on the right of the figure by reference character W2.

However, the above-discussed conventional level shift circuit indispensably requires the external capacitor 5 of a relatively great capacity and can not be implemented by the integrated circuit chip alone. Accordingly, the integrated circuit chip must have an extra connecting terminal for the capacitor 5, which undesirably increases the number of necessary manufacturing steps. Further, because the conventional level shift circuit requires two different reference voltages Vref1 and Vref2 as noted above, it needs a complicated reference-voltage generating circuit.

SUMMARY OF THE INVENTION

In view of the foregoing, it is an object of the present invention to provide an improved level shift circuit which requires no external capacitor and requires only one reference voltage.

In order to accomplish the above-mentioned object, the present invention provides a level shift circuit comprising: an input resistor, an input signal being applied to one end of the input resistor; an amplifier having an input terminal connected with the other end of the input resistor; a feedback resistor connected between the input terminal and output terminal of the amplifier; and a level-shifting resistor connected between the input terminal of the amplifier and a predetermined constant voltage point.

In one embodiment of the present invention, the level-shifting resistor may be replaced with a constant-current power supply.

In another embodiment of the present invention, the level-shifting resistor may be replaced with a resistor circuit that includes a plurality of series-connected resistors, and a switching section connected between respective connection points of the series-connected resistors and a predetermined constant voltage point.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE PREFERRED EMBODIMENTS

The following will describe embodiments of the present invention, but it should be appreciated that the present invention is not limited to the described embodiments and various modifications of the invention are possible without departing from the basic principles. The scope of the present invention is therefore to be determined solely by the appended claims.

Figure 1:
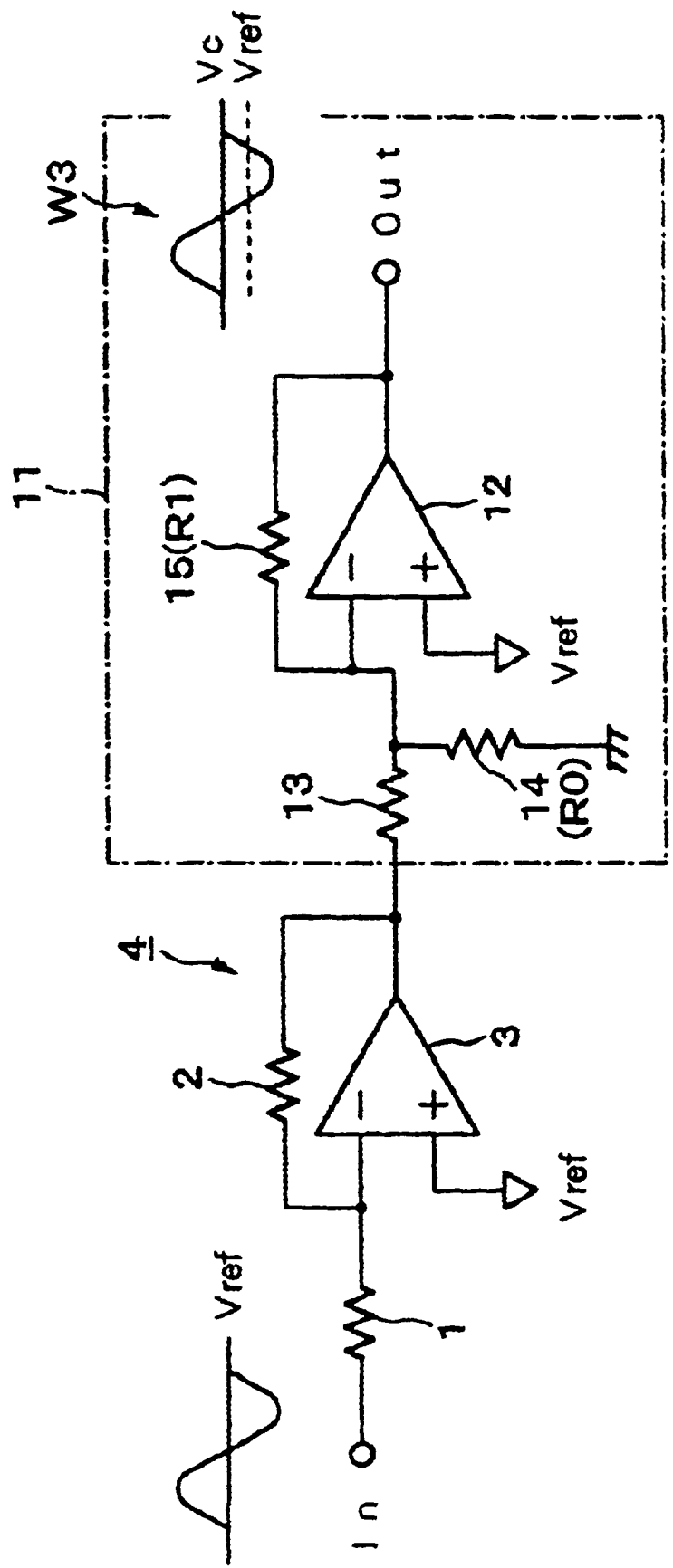
FIG. 1 is a diagram showing an exemplary general setup of a level shift circuit in accordance with a first embodiment of the present invention.

FIG. 1 is a diagram showing an exemplary general setup of a level shift circuit in accordance with a first embodiment of the present invention. The level shift circuit 11 shown here is connected to an amplifier circuit 4 which includes resistors 1 and 2 and an operational amplifier 3 and has an amplitude center level Vref, and the level shift circuit 11 shifts the level of an amplified output of the amplifier circuit 4 into a signal having an amplitude center level Vc (Vc>Vref).

Specifically, this level shift circuit 11 includes an operational amplifier 12, and an input resistor 13 having one end connected to an output terminal of the amplifier circuit 4 and the other end connected to an inverted input terminal ("−") of the operational amplifier 12. The level shift circuit 11 further includes a level-shifting resistor 14 of a resistance value R0 having one end connected to the inverted input terminal of the operational amplifier 12 and the other end connected to a ground, and a feedback resistor 15 of a resistance value R1 connected between the inverted input terminal and output terminal of the operational amplifier 12. Reference voltage Vref is applied to a noninverted input terminal ("+") of the operational amplifier 12.

In the level shift circuit 11 thus arranged, the level-shifting resistor 14 serves to lower potential at the inverted input terminal of the operational amplifier 12, and an output voltage of the operational amplifier 12 rises to make up for the potential drop. Namely, an output signal of the level shift circuit 11 represents the output of the amplifier circuit 4 having been shifted in level by a predetermined amount (see a waveform W3 on the right of the figure). The level shift amount ΔV can be expressed as follows if the amplitude center Vc of the output signal from the level shift circuit 11 is represented by Vc:

ΔV=Vc−Vref=(R1/R0)Vref

Figure 2:
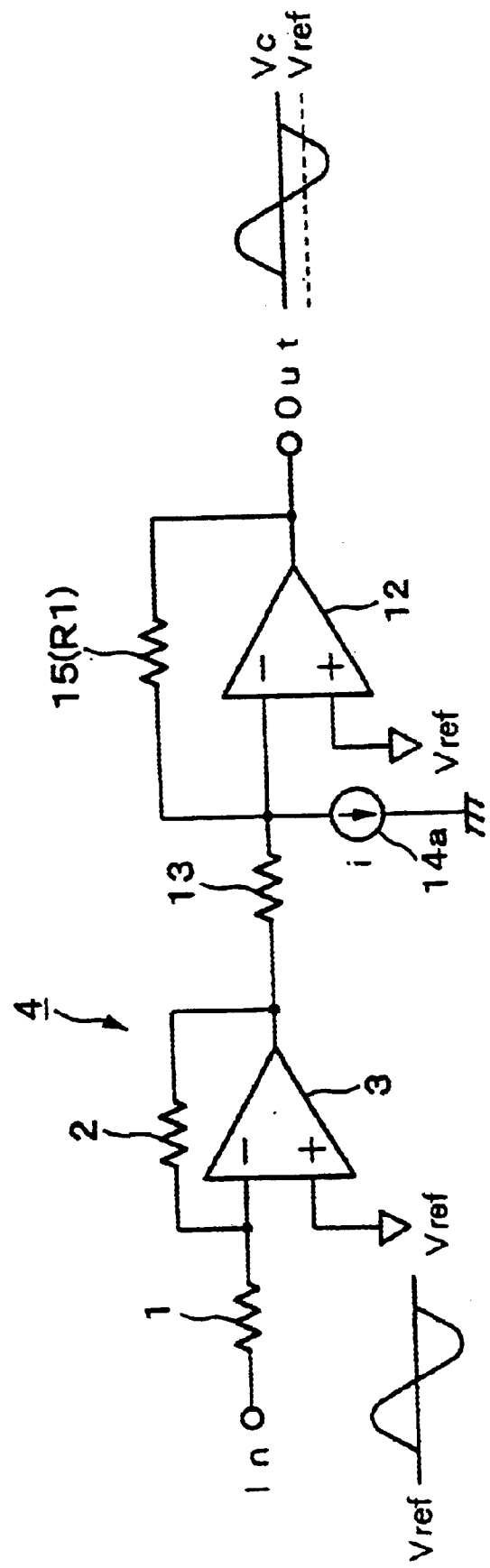
FIG. 2 is a diagram showing a modified example of the level shift circuit of FIG. 1.
Figure 3:
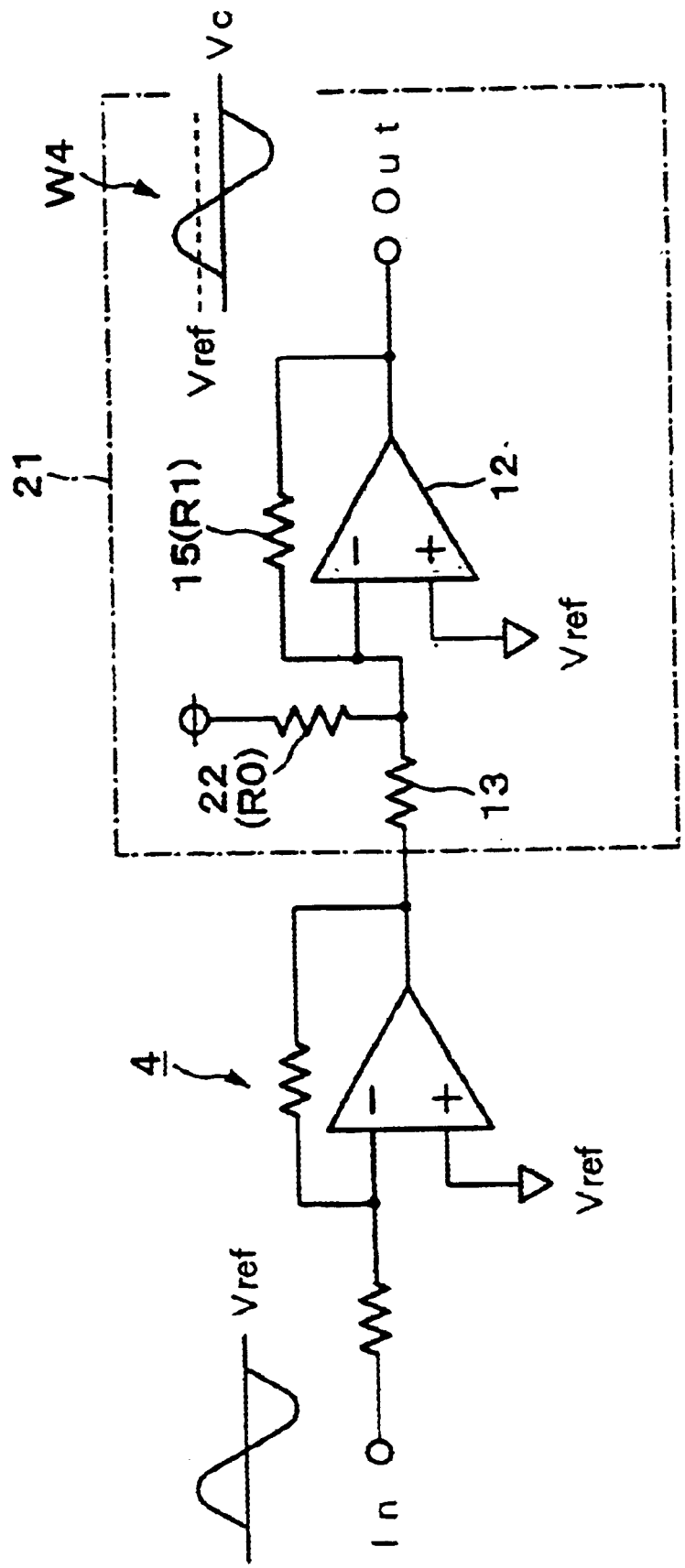
FIG. 3 is a diagram showing a level shift circuit in accordance with a second embodiment of the present invention.
Figure 4:
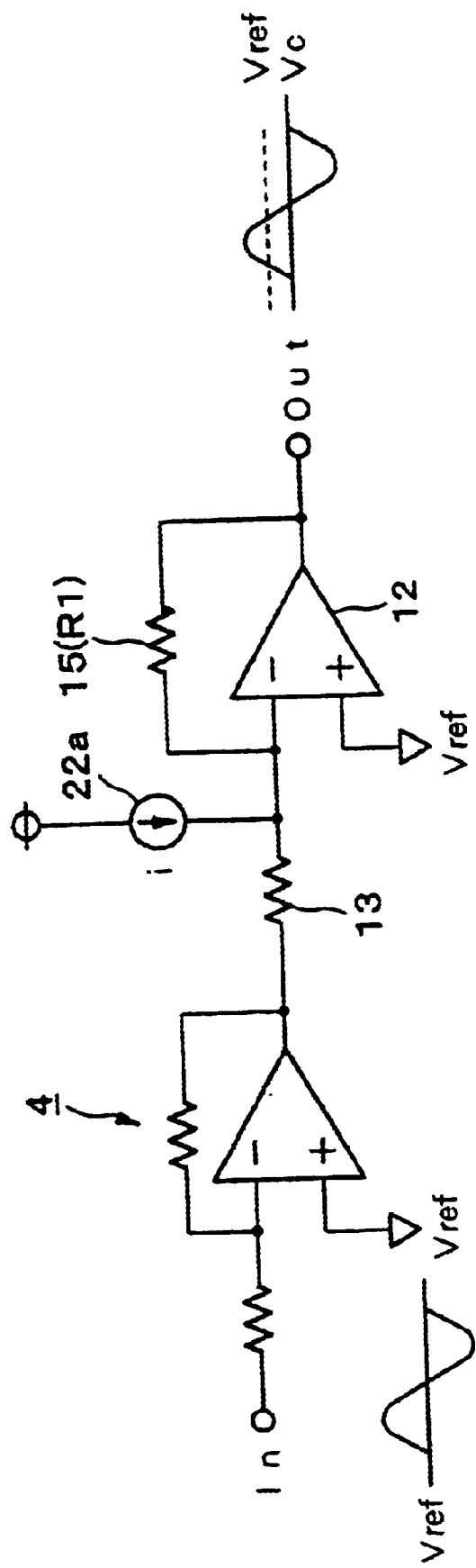
FIG. 4 is a diagram showing a modified example of the level shift circuit of FIG. 3.
Figure 5:
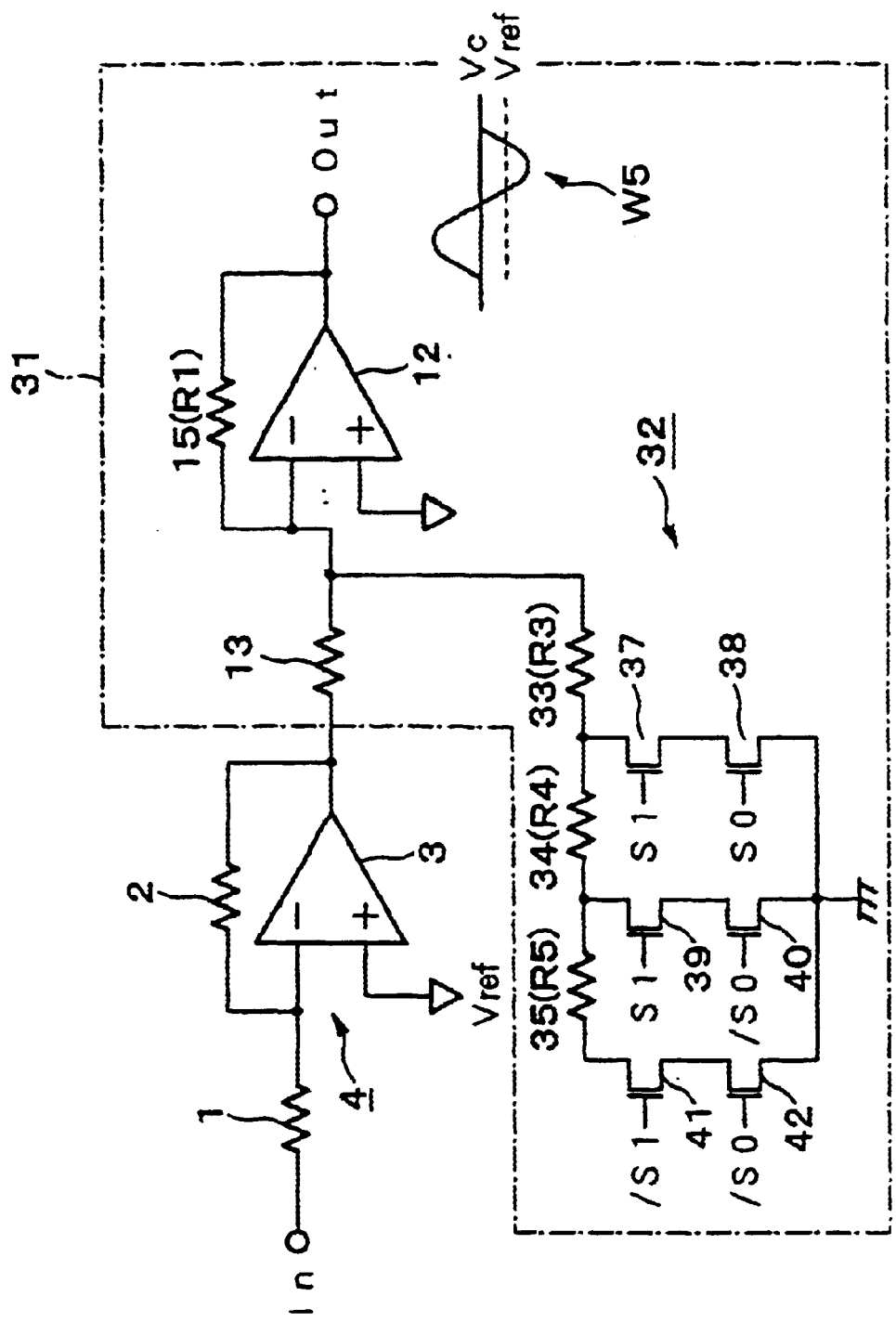
FIG. 5 is a diagram showing a level shift circuit in accordance with a third embodiment of the present invention.
Figure 6:
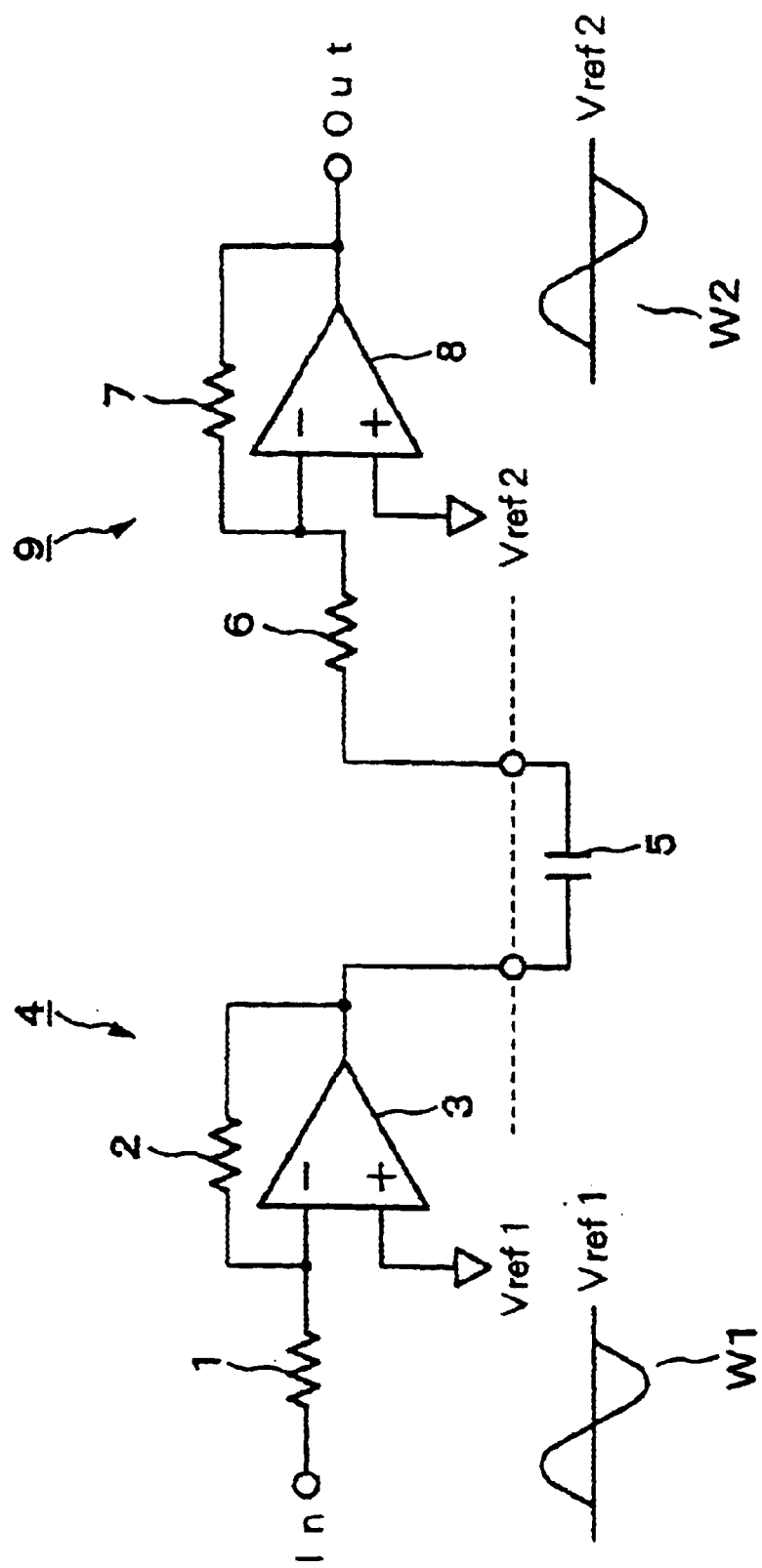
FIG. 6 is a diagram showing an example of a conventionally-known level shift circuit.

Note that a constant-current power supply may be used in place of the level-shifting resistor 14 as illustratively shown in FIG. 2. If the current of the constant-current power supply 14a is represented by i, then ΔV=Vc−Vref=R1·i FIG. 3 is a diagram showing a level shift circuit 21 in accordance with a second embodiment of the present invention. The level shift circuit 21 shown here includes a resistor 22 of a resistor value R0, in place of the resistor 14 in the circuit 11 of FIG. 1, between the operational amplifier 12 and a positive ("+") power supply terminal. In this level shift circuit 21, the output signal of the amplifier circuit 4 can be shifted by a predetermined amount in a negative ("−") direction (see a waveform W4 on the right of the figure), The level shift amount ΔV in this case can be expressed as ΔV=Vref−Vc=(R1/R0)Vref Note that, in this level shift circuit 21 too, a constant-current power supply may be used in place of the resistor 22 as illustratively shown in FIG. 4. If the current of the constant-current power supply 22a is represented by i, then ΔV=Vref−Vc=R1·i FIG. 5 is a diagram showing a level shift circuit 31 in accordance with a third embodiment of the present invention. The level shift circuit 31 shown here includes a resistor circuit 32 in place of the resistor 14 in the circuit 11 of FIG. 1. The resistor circuit 32 includes a plurality of series-connected level-shifting resistors 33, 34 and 35 having resistance values R3, R4 and R5, respectively, and a plurality of FETs (Field Effect Transistors) 37 to 42. The resistor 33 has one end connected to the inverted input terminal of the operational amplifier 12. The series-connected FETs 37 and 38 are connected between a connection point of the resistors 33, 34 and the ground, the series-connected FETs 39 and 40 are connected between a connection point of the resistors 34, 35 and the ground, and the series-connected FETs 41 and 42 are connected between the other end of the resistor 35 and the ground. Control signals S1 and S0 are applied to the gates of the FETs 37 and 38, respectively, control signals S1 and /S0 (here, the mark "/" represents inversion) are applied to the gates of the FETs 39 and 40, respectively, and control signals /S1 and /S0 are applied to the gates of the FETs 41 and 42, respectively.

In the level shift circuit 31 thus arranged, when the control signal S1 of a low (L) level and the control signal S0 of a high (H) level are applied, the FETs 37 to 42 are all turned off so that the resistor circuit 32 becomes inactive. In this case, the output signal of the amplifier circuit 4 is provided from the level shift circuit 31 after having been merely amplified with no amplitude center level shift effected. When the control signals S1 and S0 both having the L level are applied, the FETs 41 and 42 are turned on, so that the series-connected resistors 33, 34 and 35 are electrically connected between the inverted input terminal of the operational amplifier 12 and the ground. As a consequence, the output signal of the amplifier circuit 4 is level-shifted, by the level shift circuit 31, in the positive direction by a voltage ΔV that can be expressed as ΔV=Vc−Vref={R1/(R3+R4+R5)}Vref Further, when the control signal S1 of the H level and the control signal S0 of the L level are applied, the FETs 39 and 40 are turned on, so that the series-connected resistors 33 and 34 are coupled between the inverted input terminal of the operational amplifier 12 and the ground. As a consequence, the output signal of the amplifier circuit 4 is level-shifted, by the level shift circuit 31, in the positive direction by a voltage ΔV that can be expressed as ΔV=Vc−Vref={R1/(R3+R4)}Vref Similarly, when the control signals S1 and S0 both having the H level are applied, the FETs 41 and 42 are turned on, and thus the output signal of the amplifier circuit 4 is level-shifted, by the level shift circuit 31, in the positive direction by a voltage ΔV that can be expressed as ΔV=Vc−Vref=(R1/R3)Vref According to the above-described embodiment, the shift level can be varied using the control signals S1 and S0. Thus, the embodiment can appropriately accommodate variations between a plurality of power supplies, by just varying the values of the control signals S1 and S0.

It should also be appreciated that each of the resistors 33 to 35 shown in FIG. 5 can be replaced with a constant-current power supply.

Further, the other ends (other connection points) of the resistor 14 of FIG. 1, resistor 22 of FIG. 3 and resistors 33 to 35 of FIG. 5 may be connected to any suitable voltage corresponding to a desired shift amount, other than the ground and positive (+) power supply voltage.

In summary, the present invention arranged in the above-described manner can shift the amplitude center level of an A.C. input signal without using an external capacitor. Thus, the level shift circuit of the invention can be implemented by an integrated circuit chip alone, which can thereby reduce the number of necessary manufacturing steps as compared to the conventional counterparts. In addition, the present invention can eliminate the need to generate two separate reference voltages, so that it can simplify the construction of a reference-voltage generating circuit.

What is claimed is:

1. A level shift circuit, comprising:
    an input resistor to receive an input signal at a first end of the input resistor;
    an amplifier having an input terminal connected to a second end of the input resistor;
    a feedback resistor (R1) connected between the input terminal and an output terminal of the amplifier; and
    a level-shifting resistor (R0) connected between the input terminal of the amplifier and a predetermined voltage,
    wherein an output signal of the amplifier is level-shifted from an amplitude center $V_{ref}$ to an amplitude center $V_c$ such that a level shift amount (ΔV) defined by $V_c-V_{ref}$ is equal to $(R1/R0) \cdot V_{ref}$, where $V_c > V_{ref}$.

2. A level shift circuit, comprising:
    an input resistor to receive an input signal at a first end of the input resistor;

an amplifier having an input terminal connected to a second end of the input resistor;

a feedback resistor (R1) connected between the input terminal and an output terminal of the amplifier; and a constant current power supply (i) connected to the input terminal of the amplifier, wherein an output signal of the amplifier is level-shifted from an amplitude center $V_{ref}$ to an amplitude center $V_c$ such that a level shift amount ($\Delta V$) defined by $V_c-V_{ref}$ is equal to R1·i, where $V_c > V_{ref}$.

3. A level shift circuit, comprising:

an input resistor to receive an input signal at a first end of the input resistor;

an amplifier having an input terminal connected to a second end of the input resistor;

a feedback resistor (R1) connected between the input terminal and an output terminal of the amplifier; and a level-shifting resistor (R0) connected between the input terminal of the amplifier and a predetermined voltage, wherein an output signal of the amplifier is level-shifted from an amplitude center $V_{ref}$ to an amplitude center $V_c$ such that a level shift amount ($\Delta V$) defined by $V_{ref}-V_c$ is equal to $(R1/R0) \cdot V_{ref}$, where $V_c < V_{ref}$.

4. A level shift circuit, comprising:

an input resistor to receive an input signal at a first end of the input resistor;

an amplifier having an input terminal connected to a second end of the input resistor;

a feedback resistor (R1) connected between the input terminal and an output terminal of the amplifier; and a constant current power supply (i) connected to the input terminal of the amplifier, wherein an output signal of the amplifier is level-shifted from an amplitude center $V_{ref}$ to an amplitude center $V_c$ such that a level shift amount ($\Delta V$) defined by $V_{ref}-V_c$ is equal to R1·i, where $V_c < V_{ref}$.

* * * * *